US011382223B2

(12) United States Patent
Mueller et al.

(10) Patent No.: US 11,382,223 B2
(45) Date of Patent: Jul. 5, 2022

(54) SPRING AND DAMPER SYSTEM AND METHOD FOR PRODUCING SAME

(71) Applicant: LEAR CORPORATION, Southfield, MI (US)

(72) Inventors: Mark Anthony Mueller, Fenton, MI (US); Arthur Lawrence Richards, Livonia, MI (US); Brantley Natter, Brighton, MI (US); Faisal K. Sallam, Dearborn, MI (US); Paul Castellani, Sterling Heights, MI (US)

(73) Assignee: Lear Corporation, Southfield, MI (US)

( * ) Notice: Subject to any disclaimer, the term of this patent is extended or adjusted under 35 U.S.C. 154(b) by 1674 days.

(21) Appl. No.: 14/754,843

(22) Filed: Jun. 30, 2015

(65) Prior Publication Data

US 2017/0002885 A1   Jan. 5, 2017

(51) Int. Cl.
*H05K 5/00* (2006.01)

(52) U.S. Cl.
CPC .......... *H05K 5/0056* (2013.01); *H05K 5/006* (2013.01)

(58) Field of Classification Search
CPC .. H05K 5/0056; H05K 1/0271; H05K 5/0013; H05K 5/0047; H05K 5/006; H05K 5/0069; H05K 5/0269; H05K 7/12; H05K 7/14; H05K 7/1401; H05K 7/1402; H05K 7/1405; H05K 7/1417; H05K 7/1418; H05K 7/142; H05K 7/1422; H05K 7/1427
USPC ....... 248/562, 621, 636; 361/679.34–679.36, 361/759, 809
See application file for complete search history.

(56) References Cited

U.S. PATENT DOCUMENTS

| 3,845,359 | A | | 10/1974 | Fedele | |
|---|---|---|---|---|---|
| 5,208,731 | A | * | 5/1993 | Blomquist | H01L 23/4093 174/16.3 |
| 5,253,147 | A | * | 10/1993 | Kleyner | H05K 7/1418 174/255 |
| 5,373,104 | A | * | 12/1994 | Brauer | H05K 5/0013 174/562 |
| 6,449,157 | B1 | * | 9/2002 | Chu | H01L 23/4093 165/185 |
| 6,618,253 | B1 | * | 9/2003 | Szu | H01L 23/4093 257/719 |
| 6,704,976 | B1 | * | 3/2004 | Chen | H01L 23/4093 174/16.3 |
| 6,722,909 | B1 | * | 4/2004 | McHugh | H05K 7/1007 439/331 |

(Continued)

FOREIGN PATENT DOCUMENTS

DE           9304485 U1 *  5/1993   ......... B60R 16/0239

OTHER PUBLICATIONS

Merriam-Webster Online Dictionary, Definition for Housing, Apr. 21, 2009.*

*Primary Examiner* — Jonathan Liu
*Assistant Examiner* — Guang H Guan
(74) *Attorney, Agent, or Firm* — Brooks Kushman P.C.

(57) ABSTRACT

A spring and damper system for a circuit board includes a spring arrangement having a plurality of compression springs. Each of the compression springs has a contact portion and two ends which are disposed away from their respective contact portion. Each of a plurality of dampers is disposed on a respective one of the ends of the compression springs and configured to contact a portion of the circuit board.

19 Claims, 3 Drawing Sheets

(56) References Cited

U.S. PATENT DOCUMENTS

| | | | |
|---|---|---|---|
| 6,908,327 B2* | 6/2005 | Ma | H05K 7/1053 439/331 |
| 6,923,658 B2* | 8/2005 | Cromwell | H05K 3/301 361/762 |
| 6,927,981 B1* | 8/2005 | Kao | H01L 23/32 257/727 |
| 7,116,553 B2* | 10/2006 | Bleau | H04N 5/2251 361/679.48 |
| 7,170,165 B2* | 1/2007 | Berto | H01L 23/4006 165/185 |
| 7,583,516 B2* | 9/2009 | Lu | H05K 1/0271 361/807 |
| 7,916,490 B2 | 3/2011 | Yeh et al. | |
| 8,947,881 B2* | 2/2015 | Aspas Puertolas | H05K 7/2049 165/185 |
| 9,113,554 B2* | 8/2015 | Qin | H05K 7/142 |
| 9,281,585 B2* | 3/2016 | Komoto | H01R 12/714 |
| 9,485,865 B2* | 11/2016 | Higashikawa | H05K 7/142 |
| 9,661,765 B2* | 5/2017 | Wakana | H05K 7/20854 |
| 2006/0171129 A1* | 8/2006 | Berto | H01L 23/4006 361/760 |
| 2006/0198111 A1 | 9/2006 | Way | |
| 2009/0122505 A1* | 5/2009 | Lu | H05K 1/0271 361/809 |
| 2010/0018759 A1* | 1/2010 | Oe | H05K 1/0271 174/260 |
| 2010/0188828 A1 | 7/2010 | Takao | |
| 2012/0140417 A1* | 6/2012 | Aspas Puertolas | H05K 7/2049 361/709 |
| 2012/0287579 A1* | 11/2012 | Lin | H01L 23/32 361/720 |
| 2014/0157589 A1* | 6/2014 | Huang | H05K 7/1417 29/729 |
| 2017/0002885 A1* | 1/2017 | Mueller | B60L 53/16 174/16.3 |

* cited by examiner

SPRING AND DAMPER SYSTEM AND METHOD FOR PRODUCING SAME

TECHNICAL FIELD

The present invention relates to a spring and damper system, and a method for producing such a system.

BACKGROUND

With the increasing use of electronics in many different products and systems, the likelihood of these devices and their components being exposed to undesirable shock and vibration also increases. The following patents and patent applications describe various types of systems for mounting and retaining electronic components: U.S. Pat. No. 7,916,490B2, US20060198111A1, U.S. Pat. No. 3,845,359A and US20100188828A1.

SUMMARY

At least some embodiments of the present invention may include a spring and damper system for a circuit board, which includes a spring arrangement including first and second leaf springs. Each of the leaf springs is generally arcuate and has two respective ends. The spring arrangement further includes first and second cross members connecting the leaf springs. The first cross member connects a first end of the first leaf spring to a first end of the second leaf spring, and the second cross member connects a second end of the first leaf spring to a second end of the second leaf spring. The system may also include a plurality of dampers, each of which is disposed on a respective one of the ends of the leaf springs and is configured to receive a portion of the circuit board therein.

At least some embodiments of the present invention may include a spring and damper system for a circuit board, which includes a spring arrangement having a plurality of compression springs. Each of the compression springs has a contact portion and two ends which are disposed away from their respective contact portion. Each of a plurality of dampers is disposed on a respective one of the ends of the compression springs and configured to contact a portion of the circuit board.

At least some embodiments of the present invention may include a method for producing a spring and damper system for a circuit board. The method may include the step of molding a spring arrangement having a plurality of compression springs. Each of the compression springs has a contact portion and two ends. The two ends of each compression spring are disposed away from their respective contact portion. The method may further include the step of attaching a plurality of dampers to a respective one of the ends of the compression springs, the dampers being configured to receive a portion of the circuit board therein.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
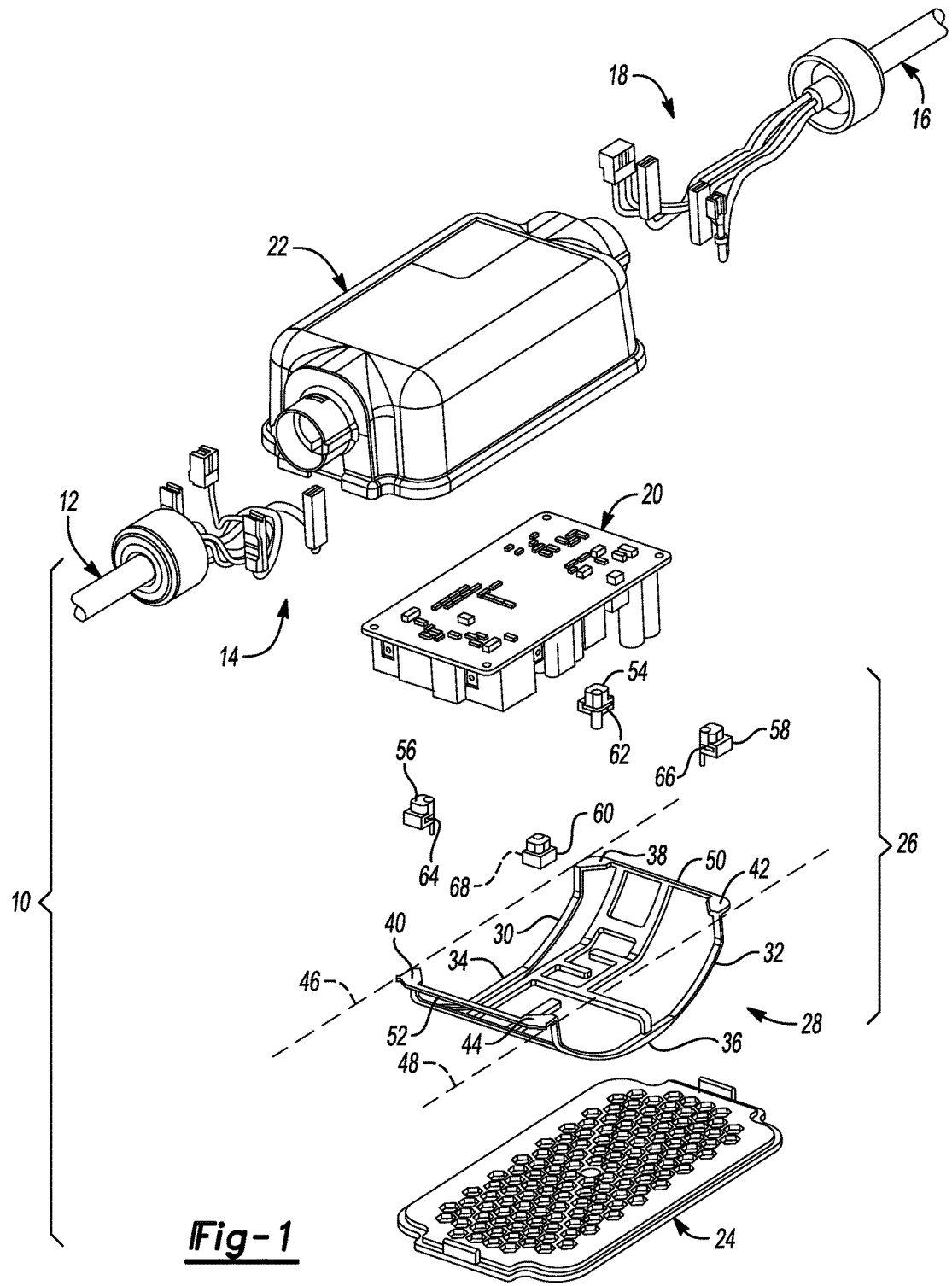
FIG. 1 shows an exploded isometric view of a cordset arrangement including a spring and damper system in accordance with embodiments of the present invention.

FIG. 1 shows a cordset 10 such as might be used as part of a vehicle charging system for an electric or hybrid electric vehicle. The cordset 10 includes a cord 12 having electrical wires 14 and another cord 16 having electrical wires 18. Although it is shown in an exploded view in FIG. 1, it is contemplated that the cords 12, 16 will be connected to each other through a circuit board 20, which is to be enclosed inside a housing, which in the embodiment shown in FIG. 1 includes upper and lower enclosures 22, 24. A spring and damper system 26 will also be enclosed inside enclosures 22, 24, and will be in contact with the circuit board 20. The spring and damper system 26 includes a spring arrangement 28 having a plurality of compression springs, which in the embodiment shown in FIG. 1, include first and second leaf springs 30, 32.

The leaf springs 30, 32 are generally arcuate in shape and have a respective contact portion 34, 36 disposed between two respective ends 38, 40 and 42, 44. The ends 38, 40, 42, 44 of the leaf springs 30, 32 are disposed at some distance away from their respective contact portions 34, 36. This feature not only helps to define how much deflection the leaf springs 30, 32 may accommodate, but may also help facilitate a support structure that keeps wires, such as the wires 14, 18, away from the circuit board 20 when the assembly 10 is complete. As further illustrated in FIG. 1, the first leaf spring 30 is oriented along a first line 46, while the second leaf spring 32 is oriented along a second line 48.

In the embodiment shown in FIG. 1, a first cross member 50 connects the first end 38 of the first leaf spring 30 to the first end 42 of the second leaf spring 32. Similarly, a second cross member 52 connects the second end 40 of the first leaf spring 30 to the second end 44 of the second leaf spring 32. Although the embodiment shown in FIG. 1 has two cross members 50, 52 connecting the leaf springs 30, 32 at their respective ends, other embodiments may have one or more cross members, some or all of which connect the leaf springs at locations other than their ends. Because the two lines 46, 48 are substantially parallel to each other, which is also the case for the cross members 50, 52, the spring arrangement 28 has a generally rectangular aspect when viewed from the top or bottom—this is shown more clearly in FIG. 2. Conversely, because of the arcuate shape of the leaf springs 30, 32, the spring arrangement 28 has a generally arcuate aspect when viewed from the side.

The spring and damper arrangement 26 also includes a plurality of dampers 54, 56, 58, 60, which are configured to be disposed on respective ends 38, 40, 42, 44 of the leaf springs 30, 32. The dampers 54, 56, 58, 60 are configured to contact a portion of the circuit board 20, and in the embodiment shown in FIG. 1, are configured to receive a portion of the circuit board 20 in slots 62, 64, 66, 68 (which is not visible in FIG. 1). It is contemplated that the dampers 54, 56, 58, 60 will be made from a soft polymeric material effective to absorb shock and vibration to help to isolate the circuit board 20. The dampers 54, 56, 58, 60 may be attached to their respective ends 38, 40, 42, 44 of the spring arrangement 28 with an adhesive, or by any other method effective to secure them in the desired location. As explained below in conjunction with FIGS. 4-5, embodiments of the invention may also include a spring arrangement in which dampers are overmolded directly onto the ends of the springs.

In addition to the damping effect provided by the dampers 54, 56, 58, 60, the leaf springs 30, 32 are configured—e.g., by being sized and shaped appropriately—such that when they are enclosed inside the upper and lower enclosures 22, 24, the contact portions 34, 36 come into contact with the lower enclosure 24. When the enclosures 22, 24 are assembled, the leaf springs 30, 32 are deflected. This augments the damping effect with a spring force transferred to the circuit board 20, and may help to further isolate the circuit board 20 from shock and vibration.

Figure 2:
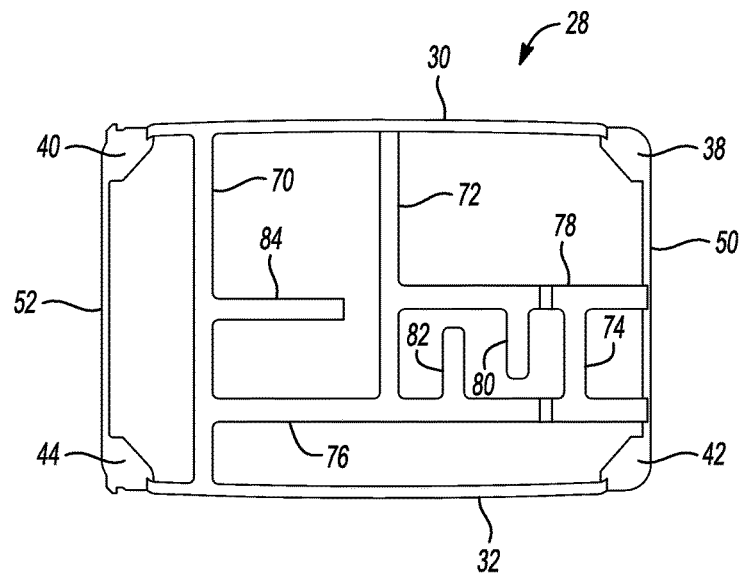
FIG. 2 shows a top plan view of the spring arrangement from FIG. 1
Figure 3:
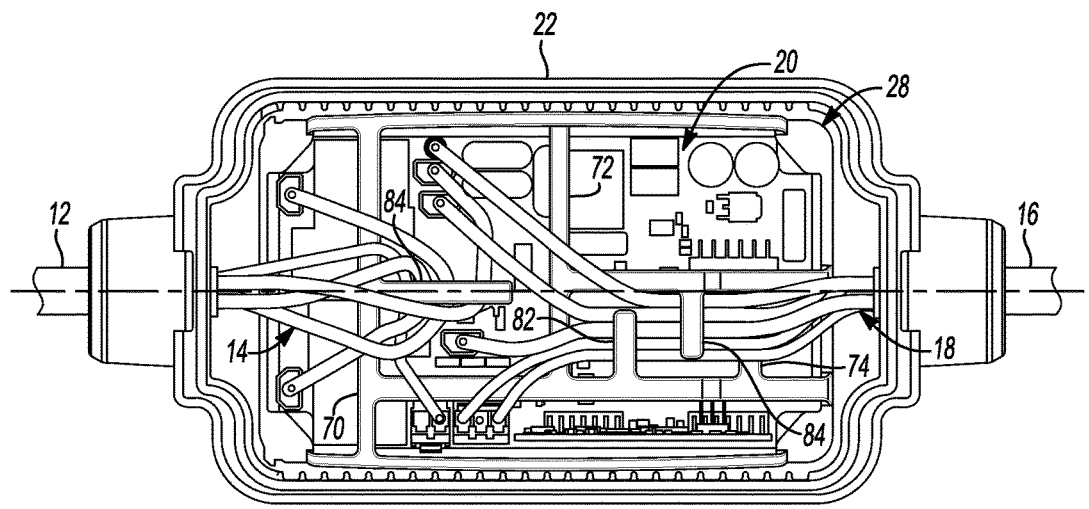
FIG. 3 shows a top plan view of the spring and damper system from FIG. 1 partially installed in an enclosure and retaining wires associated with the cordset.

FIG. 2 shows the spring arrangement 28 from a top plan view, which, as discussed above, illustrates its generally rectangular aspect. A plurality of support members 70, 72, 74, 76, 78 are disposed between the leaf springs 30, 32, and as a viewed more clearly in FIG. 1, are positioned away from the ends 38, 40, 42, 44—and their respective dampers 54, 56, 58, 60—such that they are a desired, predetermined distance from any of the components on the circuit board 20. Also shown in FIG. 2, are retention tabs 80, 82, 84, which in the embodiment shown in FIGS. 1 and 2 are cantilevered on a respective one of the support members 78, 76, 70. As shown in FIGS. 2 and 3, the two adjacent retention tabs 80, 82 are cantilevered in opposite directions. This may help, for example, to route wires over the supports and to a desired location.

The predetermined distance between the support members 70, 72, 74, 76, 78 and the circuit board 20 may be determined, for example, by defining the distance between the contact portions 34, 36 and their respective ends 38, 40, 42, 44. More specifically, by defining the perpendicular distance between the contact portions 34, 36 and the respective lines 46, 48 along which the leaf springs 30, 32 are oriented. The predetermined distance may also be affected, and therefore controlled or determined, by the height of the enclosure 22, and where within the upper enclosure 22 the circuit board 20 is located. FIG. 3 illustrates the circuit board 20 disposed inside the enclosure 22 along with the spring arrangement 28. As shown in FIG. 3, the wires 14 are wrapped around the retention tabs 84 and at least partially rest on support member 70. Similarly, the wires 18 at least partially rest on support members 72, 74, and are further secured by retention tabs 82, 84. Although FIG. 3 shows a top view, it is understood that the wires 14, 18 are well off of the circuit board 20—see, e.g., FIG. 1. Not only does this help with ensuring there is no physical contact between the wires and the circuit board, but may also help meet electromagnetic compatibility ("EMC") requirements.

Figure 4:
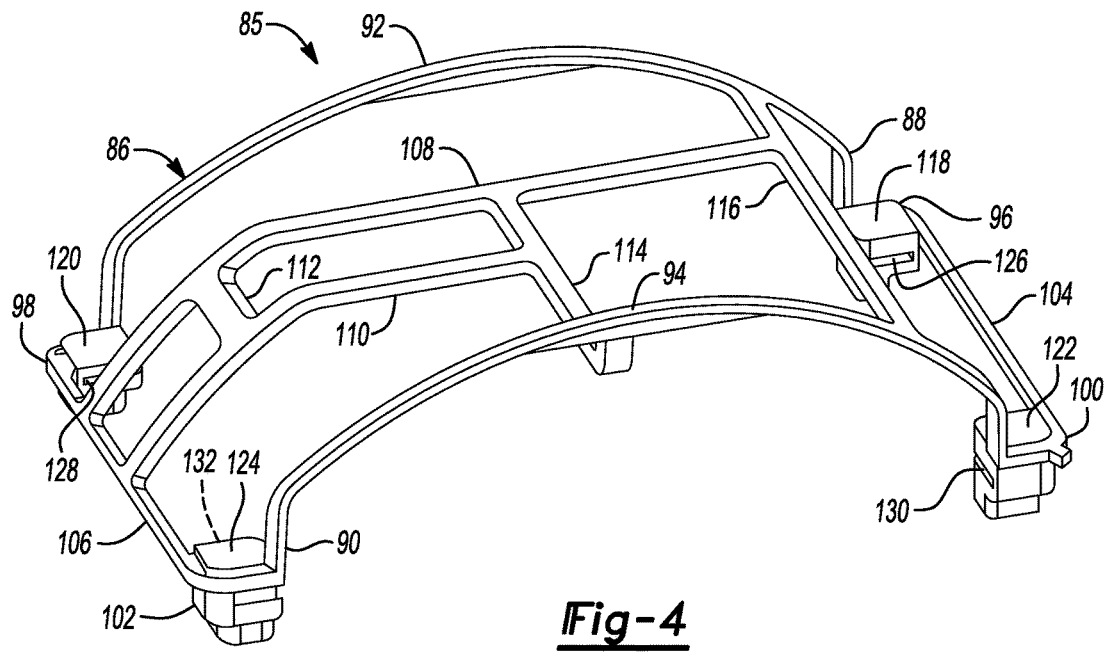
FIG. 4 shows an isometric view of a spring and damper system in accordance with embodiments of the present invention.

A spring and damper arrangement 85 in accordance with another embodiment of the invention is illustrated in FIG. 4. Similarly configured to the spring arrangement 28, a spring arrangement 86 includes compression springs 88, 90 configured as leaf springs, each having a contact portion 92, 94 and respective ends 96, 98 and 100, 102. The ends 96, 100 are connected by a first cross member 104, while the ends 98, 102 are connected by a second cross member 106. A number of support members 108, 110, 112, 114, 116 are also disposed between the leaf springs 88, 90. One difference between the spring arrangement 86 and the spring arrangement 28, is that the spring arrangement 86 does not include retention tabs, such as the retention tabs 80, 82, 84.

Figure 5:
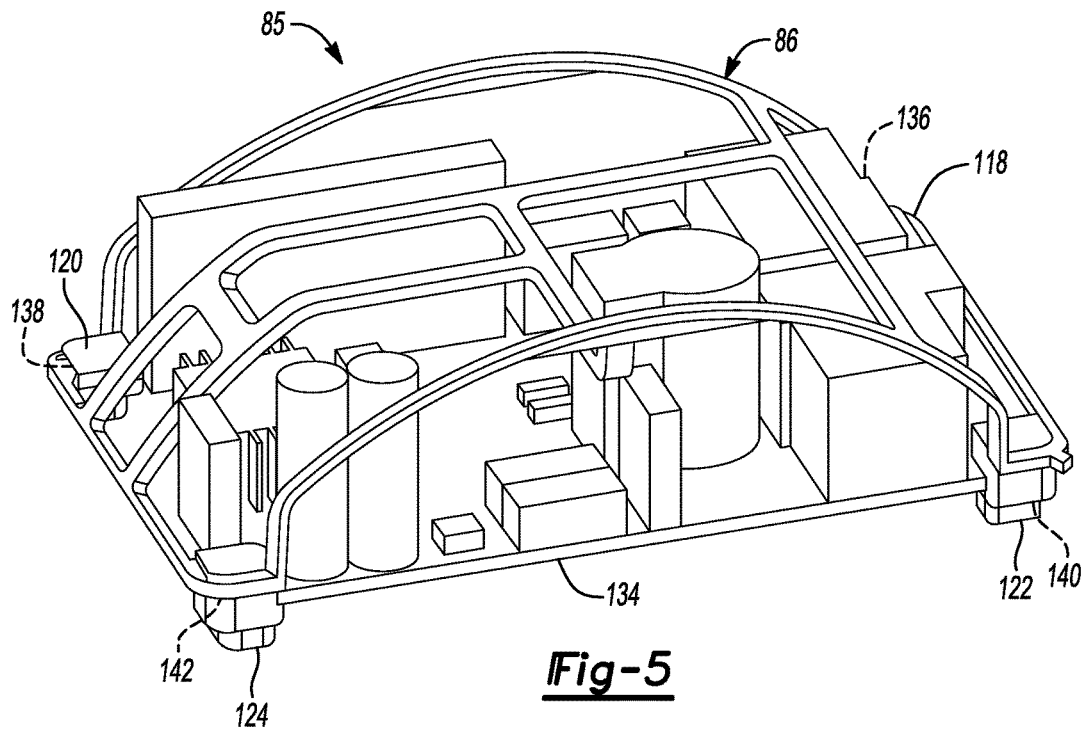
FIG. 5 shows the spring and damper system from FIG. 4 attached to a circuit board.

Another difference between the spring arrangement 86 and the spring arrangement 28 is that dampers 118, 120, 122, 124 associated with the spring arrangement 86 are each overmolded onto respective ends 96, 98, 100, 102 of the spring arrangement 86, instead of being attached in a secondary process. The dampers 118, 120, 122, 124 are also configured to receive a circuit board within respective slots 126, 128, 130, 132 (which is not visible in FIG. 4). FIG. 5 shows a circuit board 134 received by the dampers 118, 120, 122, 124. The spring arrangement 86 also has a generally rectangular aspect when viewed from the top or bottom. More particularly, the leaf springs 88, 90 are oriented relative to each other such that when the dampers 118, 120, 122, 124 receive the generally rectangular circuit board 134, each of the dampers 118, 120, 122, 124 is disposed proximate a corner 136, 138, 140, 142 of the circuit board 134—although in FIG. 5, the corners 136, 138, 140, 142 are hidden from view, being disposed inside of the respective dampers 118, 120, 122, 124. With this orientation, the spring and damper arrangement 85 further helps to secure a circuit board, such as the circuit board 134, from undesirable movement once it is installed inside an enclosure and put into use.

Embodiments of the present invention may also include a method for producing a spring and damper system, such as the spring and damper system 26 illustrated in FIG. 1. For example, the spring arrangement 28 may be molded from a relatively flexible polymeric material that will allow a desired amount of deflection and provide a certain amount of spring force. For an application such as the cordset assembly 10 shown in FIG. 1, the spring arrangement 28 is sized to cooperate with the circuit board 20. In some embodiments, the rectangular aspect of the spring arrangement 28 may have a width—e.g., the distance between ends 38 and 42—of 70-85 millimeters (mm), and a length—e.g., the distance between ends 38 and 40—of 120-135 mm. The predetermined distance discussed above, when the spring arrangement 28 is in the as-molded, undeflected state, may be, for example, 30-40 mm.

Embodiments of a method may then include attaching a plurality of dampers, such as the dampers 54, 56, 58, 60 to respective ends 38, 40, 42, 44 of the spring arrangement 28. As described above, this can occur in a secondary process after each of the components is molded separately, or is illustrated in FIG. 4, dampers may be molded directly onto the spring arrangement. In the first molding process, for example, the entire spring arrangement 85, including leaf springs 88, 90; cross members 104, 106; and support members 108, 110, 112, 114, 116 may all be molded together in a first shot, while dampers 118, 120, 122, 124 are molded over the spring arrangement 86 in a second shot. For embodiments configured as the spring arrangement 28 shown in FIG. 2, retention tabs 80, 82, 84 may also be molded directly to their respective support members 76, 78, 70 in the first shot process.

While exemplary embodiments are described above, it is not intended that these embodiments describe all possible forms of the invention. Rather, the words used in the specification are words of description rather than limitation, and it is understood that various changes may be made without departing from the spirit and scope of the invention.

Additionally, the features of various implementing embodiments may be combined to form further embodiments of the invention.

What is claimed is:

1. A spring and damper system for a circuit board, comprising:
    a spring arrangement including a first leaf spring and a second leaf spring, each being generally arcuate and having two respective ends, the spring arrangement further including a first cross member and a second cross member connecting the leaf springs, the first cross member connecting a first end of the first leaf spring to a first end of the second leaf spring, and the second cross member connecting a second end of the first leaf spring to a second end of the second leaf spring; and
    a plurality of dampers, each of the dampers contacting a respective one of the ends of the leaf springs and configured to receive a portion of the circuit board therein.

2. The spring and damper system of claim 1, wherein the spring arrangement has a generally arcuate first aspect and a generally rectangular second aspect sized to receive a rectangular circuit board.

3. The spring and damper system of claim 1, further comprising a plurality of support members disposed between the leaf springs and positioned away from the dampers.

4. The spring and damper system of claim 3, further comprising a retention tab cantilevered on one of the support members and configured to secure electrical wires.

5. The spring and damper system of claim 4, wherein the spring arrangement includes a plurality of the retention tabs, each of the retention tabs being cantilevered on a respective one of the support members, and wherein two adjacent retention tabs of the retention tabs are cantilevered in opposite directions.

6. The spring and damper system of claim 4, further comprising a housing configured to receive the spring arrangement and the circuit board, and wherein each of the leaf springs is configured such that when the housing receives the spring arrangement, a portion of each of the leaf springs contacts a portion of the housing and the leaf springs are deflected.

7. A spring and damper system for a circuit board, comprising:
    a spring arrangement including a plurality of compression springs, each having a contact portion and two ends, the two ends of each compression spring being disposed away from their respective contact portion, wherein the compression springs include two compression springs connected to each other by a plurality of cross members, one of the cross members connecting a first end of one of the two compression springs to a first end of the other of the two compression springs, and another of the cross members connecting a second end of the one of the two compression springs to a second end of the other of the two compression springs; and
    a plurality of dampers, each of the dampers contacting a respective one of the ends of the two compression springs and configured to contact a portion of the circuit board.

8. The spring and damper system of claim 7, wherein each of the two compression springs is configured as a leaf spring such that the contact portion of each leaf spring is disposed between its respective two ends.

9. The spring and damper system of claim 8, wherein the one of the two compression springs is oriented along a first line, and the other of the two compression springs is oriented along a second line different from and substantially parallel to the first line.

10. The spring and damper system of claim 9, wherein the two compression springs are oriented relative to each other such that the first and second ends of the one of the two compression springs and the first and second ends of the other of the two compression springs are configured to be disposed proximate to respective corners of the circuit board.

11. The spring and damper system of claim 10, further comprising a plurality of support members disposed between the two compression springs and positioned away from the dampers.

12. The spring and damper system of claim 11, further comprising at least one retention tab attached to at least one of the support members for receiving electrical wires.

13. The spring and damper system of claim 10, further comprising a housing configured to receive the spring arrangement and the circuit board, and wherein the spring arrangement is sized relative to the housing such that when the housing receives the spring arrangement, the contact portion of each of the two compression springs contacts a portion of the housing and the two compression springs deflect.

14. A spring and damper system for a circuit board, comprising:
    a spring arrangement including a first generally arcuate leaf spring having first and second ends and a second generally arcuate leaf spring having first and second ends, the first leaf spring being positioned substantially parallel to the second leaf spring and connected to the second leaf spring by a plurality of cross members, at least one of the cross members connecting one of the first or second ends of the first leaf spring to one of the first or second ends of the second leaf spring, and at least one other of the cross members connecting the other of the first or second ends of the first leaf spring to the other of the first or second ends of the second leaf spring; and
    a plurality of dampers positioned such that each of the first and second ends of the first leaf spring and each of the first and second ends of the second leaf spring contact at least one of the dampers, and wherein each of at least one of the dampers is configured to contact a portion of the circuit board.

15. The spring and damper system of claim 14, wherein the spring arrangement has a generally arcuate first aspect and a generally rectangular second aspect sized to contact a rectangular circuit board.

16. The spring and damper system of claim 14, further comprising a plurality of support members disposed between the first leaf spring and the second leaf spring and positioned away from the dampers.

17. The spring and damper system of claim 16, further comprising a retention tab cantilevered on one of the support members and configured to secure electrical wires.

18. The spring and damper system of claim 17, wherein the spring arrangement includes a plurality of the retention tabs, each of the retention tabs being cantilevered on a respective one of the support members, and wherein two adjacent retention tabs of the retention tabs are cantilevered in opposite directions.

19. The spring and damper system of claim 17, further comprising a housing configured to receive the spring arrangement and the circuit board, and wherein each of the first and second leaf springs is configured such that when the housing receives the spring arrangement, a portion of each of the first and second leaf springs contacts a portion of the housing and the first and second leaf springs are deflected.

* * * * *